United States Patent [19]
Hohmann

[11] Patent Number: 5,745,013
[45] Date of Patent: Apr. 28, 1998

[54] VARIABLE-FREQUENCY OSCILLATOR CONFIGURATION

[75] Inventor: Henning Hohmann, München, Germany

[73] Assignee: Siemens Aktiengesellschaft, Munich, Germany

[21] Appl. No.: 756,347

[22] Filed: Nov. 26, 1996

Related U.S. Application Data

[63] Continuation of PCT/DE95/00636, May 12, 1995.

[51] Int. Cl.$^6$ ................................................. H03B 5/08
[52] U.S. Cl. .................. 331/179; 331/36 C; 331/117 R; 331/177 V; 331/181; 334/15
[58] Field of Search .............................. 331/36 C, 117 R, 331/117 FE, 117 D, 177 V, 179, 181; 334/15

[56] References Cited

U.S. PATENT DOCUMENTS

| | | | |
|---|---|---|---|
| 3,813,615 | 5/1974 | Okazaki | 331/109 |
| 4,160,213 | 7/1979 | Carter | 325/439 |
| 4,565,978 | 1/1986 | Fenk et al. | 331/117 R |
| 4,639,691 | 1/1987 | Iigima | 331/99 |
| 5,434,543 | 7/1995 | Brilka et al. | 331/117 R |

FOREIGN PATENT DOCUMENTS

| | | |
|---|---|---|
| 2 249 086 | 4/1974 | Germany . |
| 33 33 402 A1 | 4/1985 | Germany . |
| 31 08 993 C2 | 8/1985 | Germany . |
| 43 14 424 A1 | 11/1994 | Germany . |

OTHER PUBLICATIONS

"Television Technique without Ballast" (Limann et al), Munich, 1983, 14th revised edition, pp. 5 and 90–93.

*Primary Examiner*—David Mis
*Attorney, Agent, or Firm*—Herbert L. Lerner; Laurence A. Greenberg

[57] ABSTRACT

A variable-frequency oscillator configuration, in particular for tuners, includes a feedback network for an oscillator amplifier. The feedback network contains a series circuit formed by two resonant circuit inductors and a resonant circuit capacitor, connected in parallel with a series circuit formed by a further resonant circuit capacitor and a variable capacitor. A switching device is connected to a coupling node between the two inductors, for short circuiting the first resonant circuit capacitor and the resonant circuit inductor connected thereto under the control of a switching signal. The feedback network can consequently be switched over between two frequency bands and is symmetrical with regard to the high-frequency effect.

7 Claims, 1 Drawing Sheet

VARIABLE-FREQUENCY OSCILLATOR CONFIGURATION

CROSS-REFERENCE TO RELATED APPLICATION

This application is a Continuation of International Application Ser. No. PCT/DE95/00636, filed May 12, 1995.

BACKGROUND OF THE INVENTION

Field of the Invention

The invention relates to a variable-frequency oscillator configuration, which contains an amplifier network and a feedback network.

Variable-frequency oscillators are used, for example, as local oscillators in tuners in order to produce a signal at a fixedly predetermined intermediate frequency from a high-frequency antenna signal. Such an oscillator configuration is shown, for example, in a textbook by Limann and Pelka, entitled: "Fernsehtechnik ohne Ballast" [Television Technology Without a Ballast], 14th Edition, 1993, pages 91 to 93. In that case, the amplifier network is realized within an integrated circuit. The feedback network is constructed as circuitry which is external to the integrated circuit and is made of discrete components. The amplifier network is realized symmetrically, with the result that interference influences from and to the outside do not become effective. The feedback network can be switched over, thereby enabling it to be used for both VHF frequency bands. However, the feedback network has the disadvantage of being realized asymmetrically. The result is that the circuit has a high-frequency effect on the reference potential. That necessitates an increased outlay in order to shield and stabilize the circuit.

In addition, further solutions are known in which use is indeed made of oscillators having symmetrical feedback networks, but the latter cannot be switched over. A dedicated oscillator is then required for each of the VHF frequency bands.

U.S. Pat. No. 3,813,615 shows a local oscillator for a television tuner which can be switched over between different frequency bands. The frequency-determining network has a series circuit which is formed by two resonant circuit inductors and a resonant circuit capacitor and is connected between an input of an oscillator transistor and ground. The series circuit formed by a further resonant circuit capacitor and a variable capacitor is connected in parallel therewith. A diode is connected to the coupling node between the inductors, through the use of which diode the inductor on the reference potential side can be bridged under the control of a switching signal. In order to provide amplifier feedback, a capacitor is connected between the base and emitter of the amplifier transistor and is connected through a further capacitor to ground. The frequency-determining network and the amplifier transistor are of asymmetrical construction with regard to ground and have a connection to ground which is effective in terms of high frequency.

U.S. Pat. No. 4,160,213 describes a tuner configuration with a switchable frequency band for a television set. The configuration contains a local oscillator transistor and a frequency-determining element which is connected thereto, it contains the series circuit formed by two resonant circuit inductors and a capacitor and is connected to ground. The inductor on the ground side can be bridged through a diode connected to the coupling node between the inductors. Both the oscillator transistor and the frequency-determining element act symmetrically with regard to ground.

SUMMARY OF THE INVENTION

It is accordingly an object of the invention to provide a variable-frequency oscillator configuration, which overcomes the hereinafore-mentioned disadvantages of the heretofore-known devices of this general type, which operates symmetrically with regard to the high-frequency effect and which permits switching over between different frequency bands.

With the foregoing and other objects in view there is provided, in accordance with the invention, a variable-frequency oscillator configuration, comprising an amplifier network including signal terminals; and a feedback network including first and second terminals connected to the signal terminals of the amplifier network; a first series circuit connected between the first and second terminals, the first series circuit having first and second resonant circuit inductors and a first resonant circuit capacitor, the first resonant circuit capacitor connected to the second terminal, and the first and second resonant circuit inductors having a coupling node therebetween; a second series circuit connected between the first and second terminals, the second series circuit having a variable resonant circuit capacitor and a second resonant circuit capacitor; and a switching device connected to the coupling node, for connecting the coupling node to the second terminal with regard to high-frequency signals, as a function of a switching signal.

In accordance with another feature of the invention, the switching device includes an input for the switching signal; a diode with an anode connected to the coupling node and to a voltage source, and a cathode connected to the input for the switching signal; and a first decoupling capacitor connected between the cathode of the diode and the second terminal for decoupling DC signal components.

In accordance with a further feature of the invention, the voltage source is a resistive voltage divider.

In accordance with an added feature of the invention, there is provided a resistor connected between the cathode of the diode and the input for the switching signal.

In accordance with an additional feature of the invention, there is provided a capacitor having one terminal connected to the anode of the diode and another terminal connected between the first resonant circuit capacitor and the resonant circuit inductors, and a further capacitor connected between the cathode of the diode and the first terminal.

In accordance with yet another feature of the invention, the variable resonant-circuit capacitor includes a variable capacitance diode having an anode connected through the second resonant circuit capacitor to the first terminal and a cathode connected through a second decoupling capacitor to the second terminal, for decoupling DC signal components; and a resistor connected between the cathode of the variable capacitance diode and a terminal for a tuning signal.

In accordance with a concomitant feature of the invention, there is provided a resistor connected between the anode of the variable capacitance diode and reference potential.

The circuit, which acts symmetrically, yields the advantage that no interference influences act on the circuit on the supply voltage side. Furthermore, the symmetrical construction has the effect that virtually no high-frequency radiation occurs. Elaborate shielding precautions are therefore not necessary. The same feedback network can be used for both VHF frequency bands by virtue of the possibility of switching over between different frequency bands. Overall, then, a symmetrically acting circuit is produced with a low component outlay.

3

Other features which are considered as characteristic for the invention are set forth in the appended claims.

Although the invention is illustrated and described herein as embodied in a variable-frequency oscillator configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
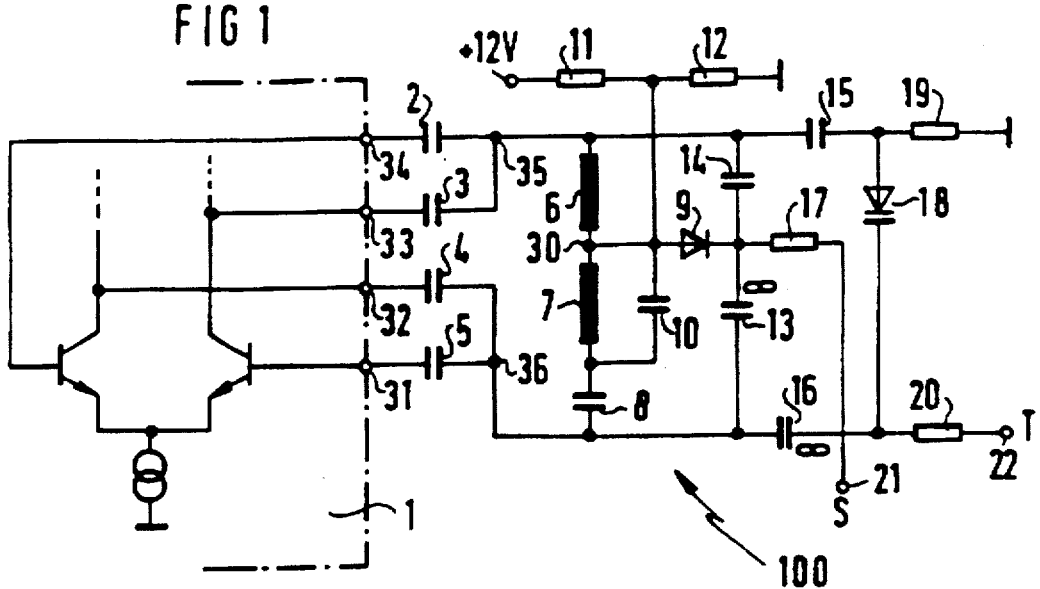
FIG. 1 is a schematic circuit diagram of an oscillator configuration according to the invention.

Referring now to the figures of the drawings in detail and first, particularly, to FIG. 1 thereof, there is seen an oscillator configuration which contains a differential amplifier 1 of bipolar construction, that is usually constructed as an integrated circuit. Inputs 31, 34 and outputs 32, 33 of the amplifier are routed outwards to be connected to a feedback network 100. The feedback network 100 has a first terminal 35 and a second terminal 36, which are connected through respective coupling capacitors 2, 3, 4, 5 to the inputs and outputs of the amplifier 1.

The feedback network 100 contains a first series circuit formed by a first and a second inductor 6, 7 and a first capacitor 8 between the terminals 35, 36. The inductors 6, 7 form resonant circuit inductors which are effective at high frequency, and the capacitor 8 forms a resonant circuit capacitor which is effective at high frequency. The coil 6 in this case is connected to the terminal 35 and the capacitor 8 is connected to the terminal 36. A coupling node between the coils 6, 7 is designated by reference numeral 30.

A second series circuit formed by a second capacitor 15 acting as resonant circuit capacitor and a variable capacitor 18, is connected in parallel with the series circuit 6, 7, 8. The variable capacitor 18 is constructed as a variable capacitance diode, having an anode terminal which is coupled to the capacitor 15 and a cathode terminal which is coupled to the terminal 36. In order to provide a DC supply, a coupling node between the diode 18 and the capacitor 15 is connected through a resistor 19 to reference potential (ground). The effective capacitance of the diode 18 is set through a terminal 22, which is connected through a resistor 20 to the cathode of the diode 18. Elements 18, 20 and 22 form a variable resonant circuit capacitor. A tuning voltage T is usually present at the terminal 22. In order to decouple the rest of the circuit from DC signal components, a node between the resistor 20 and the diode 18 is coupled through a capacitor 16 to the terminal 36. A symbol ∞ on the capacitor 16 is intended to indicate that this capacitor acts as an open circuit for low-frequency signals and DC signals/DC voltage signals, but acts as a short circuit for high-frequency signals.

4

The coupling or connecting node 30 between the coils 6, 7 is connected to a switching device 9, 17, 21. The node 30 can be connected in terms of high frequency to the terminal 36 of the feedback network, as a result of a corresponding signal level of a signal S at a terminal 21. This causes the coil 7 and the capacitor 8 to be inactive. In detail, the switching device contain a diode 9 having an anode which is connected to the node 30 and a cathode which is connected through a resistor 17 to the terminal 21. The cathode of the diode 9 is connected through a capacitor 13 to the second terminal 36 of the feedback network. A constant voltage is fed in on the anode side, preferably half the supply voltage. This is expediently carried out through the use of a resistive voltage divider 11, 12 connected between the supply voltage terminals. The capacitor 13 is in turn dimensioned in such a way that it acts as a short circuit for high-frequency signals. Two further capacitors 10, 14 are provided. The capacitor 10 is connected in parallel with the inductor 7 and the capacitor 14 is connected between the cathode of the diode 9 and the first terminal 35 of the feedback network. These capacitors 10, 14 are used for synchronization setting and for improving the temperature response.

Figure 2:
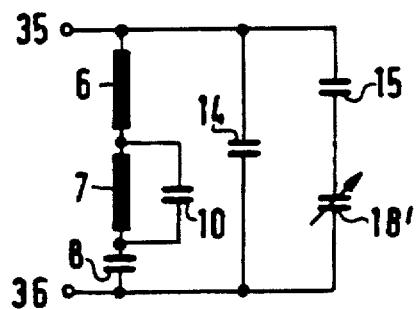
FIG. 2 is an equivalent circuit diagram of a feedback network for a first frequency band.
Figure 3:
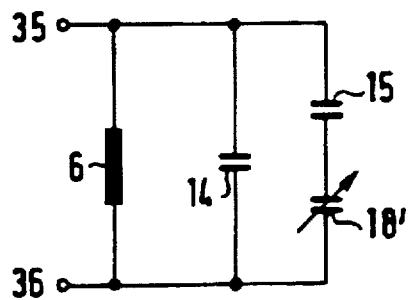
FIG. 3 is an equivalent circuit diagram of the feedback network for a second frequency band.

The circuit operates as described below:

The first case considered is that where the signal S at the terminal 21 has an H level. The diode 9 is then reverse-biased. A resonant circuit shown in FIG. 2 is then effective between the terminals 35, 36. This resonant circuit essentially includes the inductors 6, 7, with which the capacitor 8 is connected in series. The capacitor 15 and a variable capacitor 18' are connected in parallel therewith. The capacitor 14 acts between the terminals 35, 36, and the capacitor 10 acts in parallel with the inductor 7. The variable capacitor 18' is used for fine tuning to the set transmitter in the frequency band.

The second case considered is that where the signal S at the terminal 21 has an L level. The diode 9 is then forward-biased, with the result that its cathode is connected to the terminal 36 through the capacitor 13 which acts as a short circuit in terms of high frequency. As a result, the capacitors 8, 10 and the inductor 7 are short-circuited. The resonant circuit which is effective between the terminals 35, 36 then essentially includes the inductor 6, with which the capacitor 14 and the series circuit formed by the capacitor 15 and the variable capacitor 18', are respectively connected in parallel. As a result of the absence of the frequency-determining elements 7, 8, the oscillator is operated in a different frequency band. The variable capacitor 18' can once again be used for tuning to a specific transmitter within this frequency band.

I claim:

1. A variable-frequency oscillator configuration, comprising:

an amplifier network including signal terminals; and a feedback network including:

first and second terminals connected to said signal terminals of said amplifier network;

a first series circuit connected between said first and second terminals, said first series circuit having first and second resonant circuit inductors and a first resonant circuit capacitor, said first resonant circuit capacitor connected to said second terminal, and said first and second resonant circuit inductors having a coupling node therebetween;

a second series circuit connected between said first and second terminals, said second series circuit having a variable resonant circuit capacitor and a second resonant circuit capacitor; and a switching device connected to said coupling node, for connecting said coupling node to said second terminal with regard to high-frequency signals, as a function of a switching signal.

2. The oscillator configuration according to claim 1, wherein said switching device includes:

an input for the switching signal;

a diode with an anode connected to said coupling node and to a voltage source, and a cathode connected to said input for the switching signal; and a first decoupling capacitor connected between the cathode of said diode and said second terminal for decoupling DC signal components.

3. The oscillator configuration according to claim 2, wherein said voltage source is a resistive voltage divider.

4. The oscillator configuration according to claim 2, including a resistor connected between the cathode of said diode and said input for the switching signal.

5. The oscillator configuration according to claim 2, including a capacitor having one terminal connected to the anode of said diode and another terminal connected between said first resonant circuit capacitor and said resonant circuit inductors, and a further capacitor connected between the cathode of said diode and said first terminal.

6. The oscillator configuration according to claim 1, wherein said variable resonant-circuit capacitor includes:

a variable capacitance diode having an anode connected through said second resonant circuit capacitor to said first terminal and a cathode connected through a second decoupling capacitor to said second terminal, for decoupling DC signal components; and a resistor connected between the cathode of said variable capacitance diode and a terminal for a tuning signal.

7. The oscillator configuration according to claim 6, including a resistor connected between the anode of said variable capacitance diode and reference potential.

* * * * *

UNITED STATES PATENT AND TRADEMARK OFFICE
CERTIFICATE OF CORRECTION

PATENT NO. : 5,745,013
DATED      : April 28, 1998
INVENTOR(S) : Henning Hohmann It is certified that error appears in the above-indentified patent and that said Letters Patent is hereby corrected as shown below:

On the title page,

Item [30] should read as follows:

May 26, 1994  [DE]    Germany ..... 44 18 432

Signed and Sealed this

Fourth Day of August, 1998

Attest:

BRUCE LEHMAN

Attesting Officer

Commissioner of Patents and Trademarks